United States Patent
Roh et al.

(10) Patent No.: US 9,881,785 B2
(45) Date of Patent: Jan. 30, 2018

(54) METHOD OF PREVENTING CHARGE ACCUMULATION IN MANUFACTURE OF SEMICONDUCTOR DEVICE

(71) Applicant: SAMSUNG ELECTRONICS CO., LTD., Suwon-si (KR)

(72) Inventors: Young-geun Roh, Seoul (KR); Un-jeong Kim, Hwaseong-si (KR); Chang-won Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 13/783,466

(22) Filed: Mar. 4, 2013

(65) Prior Publication Data

US 2014/0057451 A1    Feb. 27, 2014

(30) Foreign Application Priority Data

Aug. 21, 2012    (KR) .................. 10-2012-0091469

(51) Int. Cl.
| | |
|---|---|
| *H01L 21/02* | (2006.01) |
| *H01L 21/263* | (2006.01) |
| *H01L 21/28* | (2006.01) |
| *H01L 21/311* | (2006.01) |
| *H01J 37/02* | (2006.01) |

(52) U.S. Cl.
CPC ...... *H01L 21/02115* (2013.01); *H01J 37/026* (2013.01); *H01L 21/2633* (2013.01); *H01L 21/28123* (2013.01); *H01L 21/31105* (2013.01); *H01J 2237/0041* (2013.01)

(58) Field of Classification Search
CPC .......... H01L 21/02115; H01L 21/2633; H01L 21/28123; H01L 21/31105
See application file for complete search history.

(56) References Cited

U.S. PATENT DOCUMENTS

| | | | |
|---|---|---|---|
| 6,586,158 | B2 | 7/2003 | Dobisz et al. |
| 6,773,865 | B2 | 8/2004 | Dobisz et al. |
| 2006/0272796 | A1 | 12/2006 | Asmussen et al. |
| 2007/0284557 | A1 | 12/2007 | Gruner et al. |
| 2009/0155578 | A1 | 6/2009 | Zhamu et al. |
| 2010/0295023 | A1* | 11/2010 | Franklin et al. .............. 257/24 |
| 2011/0121409 | A1* | 5/2011 | Seo ................... H01L 21/02115 257/410 |
| 2014/0048799 | A1* | 2/2014 | Tour .................... H01L 27/2463 257/43 |

FOREIGN PATENT DOCUMENTS

JP    201163492 A    3/2011

* cited by examiner

*Primary Examiner* — Seahvosh Nikmanesh
(74) *Attorney, Agent, or Firm* — Sughrue Mion, PLLC

(57) ABSTRACT

A method of preventing a charge accumulation in the manufacturing process of a semiconductor device is provided. The method includes: forming a material layer on a substrate; patterning (or processing) the material layer; and forming a graphene layer before patterning the material layer, wherein the graphene layer is formed on a surface of the material layer or on a surface of the substrate under the material layer. The substrate may be an insulation substrate. In addition, the substrate may have a stacked structure including a plurality of layers.

7 Claims, 2 Drawing Sheets

+
BAKE

METHOD OF PREVENTING CHARGE ACCUMULATION IN MANUFACTURE OF SEMICONDUCTOR DEVICE

CROSS-REFERENCE TO RELATED APPLICATION

This application claims priority from Korean Patent Application No. 10-2012-0091469, filed on Aug. 21, 2012, in the Korean Intellectual Property Office, the disclosure of which is incorporated herein in its entirety by reference.

BACKGROUND

Field

Apparatuses and methods consistent with exemplary embodiments relate to the manufacture of a semiconductor device, and more particularly, to a method of preventing a charge accumulation by using a graphene layer in the manufacture of a semiconductor device.

Description of the Related Art

In an object that is placed in a strong electric field or an object to which a great number of electric charges are applied, electric charges are distributed on the surface thereof unless the object is not a metal, and thus, the progress of subsequent processes may be disturbed.

In a process, which uses electron beam lithography or a focused ion beam (FIB), it is fundamental to process a desired structure by applying a great number of electric charges thereto. However, when accumulated electric charges exist in a target material layer, the pattern formation and processing for the target material layer may be distorted.

A metal thin film may be formed on the surface of the target material layer to overcome the above problem. However, the metal thin film formed on the surface of the target material layer may damage a substrate and may damage a previously formed pattern. In addition, the metal thin film may operate as an obstacle in transferring a previously formed pattern to the substrate.

To secure conductivity of the metal thin film, a noble metal such as gold or silver is used as the metal thin film. However, in this case, the whole manufacturing cost increases.

A product using a conducting polymer is introduced to improve such a shortcoming, but has a problem in that a preservation period is short and a change in quality may occur in specific conditions. For example, a residue may form due to deterioration in the FIB process.

SUMMARY

One or more exemplary embodiments may provide methods of preventing a charge accumulation, which may prevent the damage of a target material layer or a distortion of a pattern during the manufacturing process of a semiconductor device.

Additional exemplary aspects and advantages will be set forth in part in the description which follows and, in part, will be apparent from the description, or may be learned by practice of the presented embodiments.

According to an aspect of an exemplary embodiment, a method of preventing a charge accumulation in the manufacturing process of a semiconductor device includes: forming a material layer on a substrate; and patterning the material layer, wherein a graphene layer is formed under or on the material layer before patterning the material layer.

The substrate may be an insulation substrate. In addition, the substrate may have a stacked structure including a plurality of layers.

The material layer may include a silicon oxide layer, a silicon nitride layer, or an insulating layer that is capable of being patterned by using an electron beam or a focused ion beam (FIB).

The graphene layer may include a single layer or a plurality of layers.

The graphene layer may be formed only on a portion between the substrate and the material layer. The graphene layer may be formed only on a portion of an upper surface of the material layer.

A process of forming the graphene layer may include: coating a solvent, including graphene flakes, on a surface of the material layer, on which the graphene layer is to be formed; and baking a resultant structure on which the solvent has been coated.

According to an aspect of another exemplary embodiment, a method of preventing a charge accumulation in the manufacturing process of a semiconductor device includes forming a graphene layer on or under a target material layer. The graphene layer has conductivity of a metal level and has a very thin structure, and thus does not operate as an obstacle when transferring a pattern thereof. In addition, the graphene layer may be easily removed by using plasma or the like, has a long preservation period, hardly deteriorates, and has a low reactivity with a different material.

By using such a graphene layer, when a great number of electric charges are applied to a target material layer, a charge accumulation on the surface of the target material layer may be prevented and another path of electric charges may be provided. Accordingly, a distortion of a material layer pattern and the damage or destruction of a material layer pattern, which occur when using electron beam lithography or a focused Ion beam (FIB), may be prevented. In addition, the graphene layer may be used in electromagnetic wave shielding and protection for a structure against a strong electric field.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
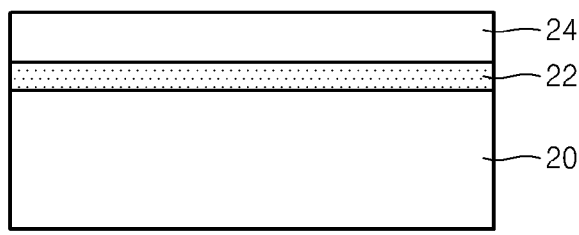
FIG. 1 is a cross-sectional view illustrating a method of preventing a charge accumulation in the manufacturing process of a semiconductor device, according to an exemplary embodiment.

A method of preventing a charge accumulation in the manufacturing process of a semiconductor device, according to an exemplary embodiment, will now be described in detail with reference to the accompanying drawings. In the drawings, thicknesses of layers and regions may be exaggerated for clarity.

FIG. 1 is a cross-sectional view illustrating a method of preventing a charge accumulation in the manufacturing process of a semiconductor device.

Referring to FIG. 1, a graphene layer 22 is formed on the upper surface of a substrate 20. The graphene layer 22 may be formed separately from the substrate 20. In other words, the graphene layer 22 may be formed in a location separate from the substrate 20, and may then be transferred to the upper surface of the substrate 20. For example, the graphene layer 22 may be formed by chemical vapor deposition (CVD) and may then be transferred to the upper surface of the substrate 20. After the graphene layer 22 is disposed on the substrate 20, the substrate 20 may have the effect of having permanent conductivity. The graphene layer 22 may be a single layer or may be multiple layers. In the case where the graphene layer 22 includes multiple layers, the graphene layer 22 may have a stacked form in which a plurality of single layers are stacked. A material layer 24 is formed on the graphene layer 22. The material layer 24 is a layer that is to be patterned or processed by using an electron beam or a focused ion beam (FIB). The material layer 24 may be an insulating layer, and may be, for example, a silicon oxide layer or a silicon nitride layer. If the material layer 24 is not a material having conductivity, the material layer 24 may be any material layer that may be patterned by using the electron beam or a FIB.

Figure 2:
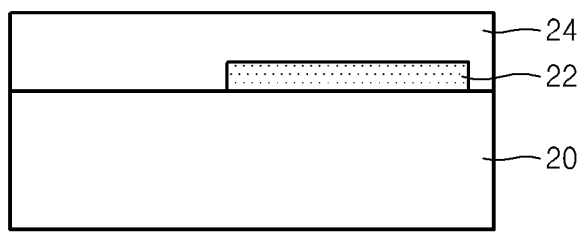
FIG. 2 is a cross-sectional view illustrating a case in which a graphene layer is formed only on a portion of an upper surface of a substrate.

The graphene layer 22 may be formed over the entirety of the whole upper surface of the substrate 20. However, as illustrated in FIG. 2, the graphene layer 22 may alternately be formed on only a portion of the upper surface of the substrate 20. Due to the conductivity of the graphene layer 22, it is important that the graphene layer 22 exists, but the graphene layer 22 may be formed on the entirety of the whole upper surface of the substrate 20 or only on a portion of the upper surface of the substrate 20.

In FIG. 1 or FIG. 2, after performing a patterning process with respect to the material layer 24, a semiconductor device may be formed by depositing material layers constituting the semiconductor device. For example, a transistor may be formed by performing a process of forming a gate deposition material, and a process of forming a source and a drain.

Figure 3:
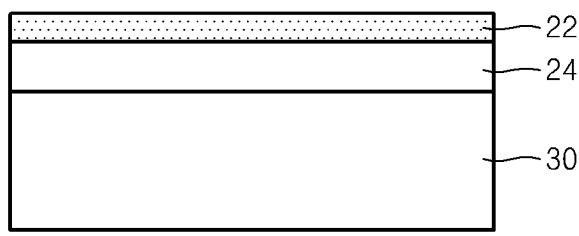
FIG. 3 is a cross-sectional view illustrating a method of preventing a charge accumulation in the manufacturing process of a semiconductor device, according to an exemplary embodiment.

FIG. 3 is a cross-sectional view illustrating a method of preventing a charge accumulation in the manufacturing process of a semiconductor device. Like reference numerals are used with respect to elements that are the same as those illustrated in FIG. 1, and descriptions of the same elements are omitted.

Referring to FIG. 3, a material layer 24 is formed on a substrate 30. A graphene layer 22 is formed on the upper surface of the material layer 24. The substrate 30 may be an insulation substrate, and, for example, may be a sapphire substrate.

Figure 4:
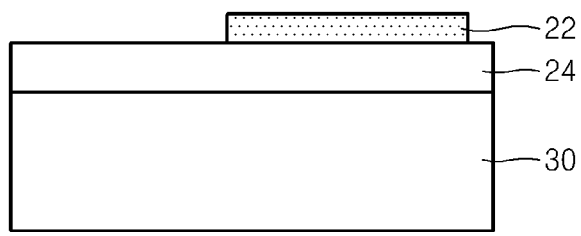
FIG. 4 is a cross-sectional view illustrating a case in which a graphene layer is formed only on a portion of an upper surface of a material layer.

In FIG. 3, the graphene layer 22 is formed to cover the whole upper surface of the material layer 24. However, as illustrated in FIG. 4, the graphene layer 22 may be formed only on a portion of the upper surface of the material layer 24. The reason for this is the same as that described with reference to FIG. 2.

As in FIG. 3 and FIG. 4, in the case where the graphene layer 22 is directly formed on the upper surface of the material layer 24, the substrate 30 has no conductivity.

The cases of FIG. 3 and FIG. 4 may be applied to a case where a temporary surface conductivity is needed.

Figure 5:
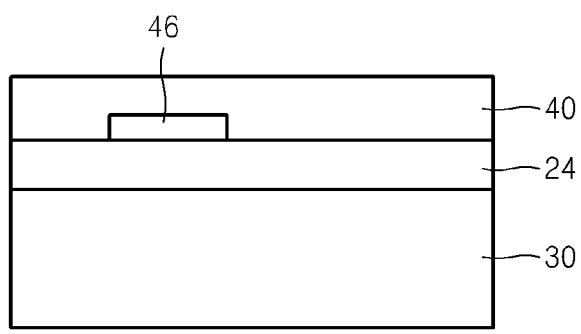
FIGS. 5 and 6 are cross-sectional views illustrating a method of preventing a charge accumulation in the manufacturing process of a semiconductor device, according to an exemplary embodiment.

FIG. 5 is a cross-sectional view illustrating a method of preventing a charge accumulation in the manufacturing process of a semiconductor device. Like reference numerals are used with respect to elements that are the same as those illustrated in FIG. 1, and descriptions of the same elements are omitted.

Referring to FIG. 5, a material layer 24 is formed on a substrate 30. A material pattern 46 may be formed on the material layer 24. The material pattern 46 may be an insulating pattern. The material pattern 46 may be a portion of the material layer 24. When, in this manner, a convex portion such as the material pattern 46, that is, a ridge portion exists on the flat material layer 24, a graphene layer may be formed by using a method that is different from a method of transferring a graphene layer, which is used in the cases of FIG. 1 and FIG. 3.

For example, as illustrated in FIG. 5, a solvent 40 covering the material pattern 46 is coated on the material layer 24. The solvent 40 may include graphene flakes. For example, dimethylformamide or N-methylpyrrolidone may be used as the solvent 40. The size of the graphene flakes included in the solvent 40 may be, for example, in the range of about 10 nm to about 10 um.

After coating the solvent 40, a resultant structure on which the solvent 40 has been coated is baked. The baking of the resultant structure may be performed at a predetermined temperature, and, for example, may be performed in the range of about 110° C. to about 140° C.

Figure 6:
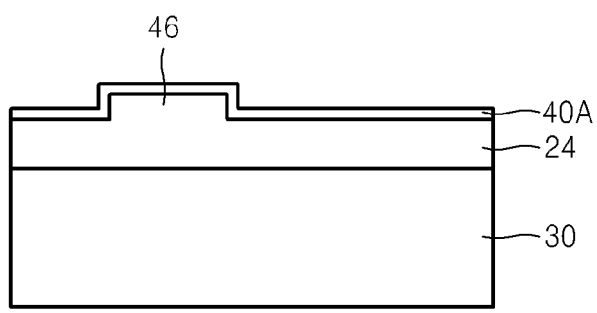

By the baking, a graphene layer 40A is formed on the upper surface of the material layer 24 as illustrated in FIG. 6. After forming the graphene layer 40A, the material layer 24 is patterned to achieve a desired form. In this case, the graphene layer 40A may also be patterned together with the material layer 24.

The graphene layer 40A described with reference to FIGS. 5 and 6 may be used as the graphene layer 22 of FIG. 1.

The method illustrated in FIGS. 5 and 6 may be applied to also a case where a concave portion exists in the material layer 24.

Since the method illustrated in FIGS. 5 and 6 uses a solvent coating, a uniform graphene layer may be formed also on an uneven portion.

In FIGS. 1 through 6, the substrate 20 or 30 may be simply a substrate including a single layer. However, the substrate 20 or 30 may be a lower structure of a semiconductor device, which includes a stacked structure having a plurality of layers.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A method of preventing a charge accumulation in a manufacturing process of a semiconductor device, the method comprising:
    forming a material layer on a substrate;
    after forming the material layer, forming a graphene layer on the material layer; and
    patterning the material layer,
    wherein a convex portion is formed on the material layer and the convex portion is covered with the graphene layer.

2. The method of claim 1, wherein the substrate is an insulation substrate.

3. The method of claim 1, wherein the substrate has a stacked structure comprising a plurality of layers.

4. The method of claim 1, wherein the material layer comprises one of a silicon oxide layer, a silicon nitride layer, and an insulating layer, and the patterning the material layer comprises patterning the material layer by using one of an electron beam and a focused ion beam.

5. The method of claim 1, wherein a process of forming the graphene layer comprises:
   coating a solvent comprising graphene flakes on a surface of the material layer; and
   baking a resultant structure including the coated solvent.

6. The method of claim 1, wherein the patterning the material layer comprises patterning the material layer using one of an electron beam and a focused ion beam.

7. A method of preventing a charge accumulation in a manufacturing process of a semiconductor device, the method comprising:
   forming a material layer on a substrate;
   after forming the material layer, forming a graphene layer on the material layer; and
   patterning the material layer,
   wherein a convex portion is formed on the material layer, the convex portion is covered with the graphene layer and the forming the material layer on the substrate and the forming the graphene layer on the material layer are sequentially performed.

\* \* \* \* \*